United States Patent

Fineran et al.

[15] 3,701,144

[45] Oct. 24, 1972

[54] HIGH FREQUENCY ANALOG-TO-DIGITAL CONVERTER

[72] Inventors: Dennis E. Fineran, Santa Ana; Samuel J. Fendley, Mountain View, both of Calif.

[73] Assignee: The United States of America as represented by the Secretary of the Navy

[22] Filed: Oct. 28, 1970

[21] Appl. No.: 84,684

[52] U.S. Cl......340/347 AD, 179/15 AP, 179/15 BA, 307/235 R, 325/38 A, 328/146, 340/347 SH

[51] Int. Cl...............................................H03k 13/02

[58] Field of Search.....................................340/347; 179/1 SA, 15.55, 15 A, 15 AP, 15 BC; 325/38 A; 330/69; 328/146, 147, 149; 307/235 R

[56] References Cited

UNITED STATES PATENTS

| | | | |
|---|---|---|---|
| 3,237,113 | 2/1966 | Klein | 330/69 X |
| 3,305,854 | 2/1967 | Witt | 340/347 |
| 3,396,381 | 8/1968 | Aitken | 340/347 |
| 3,142,056 | 7/1964 | Martin et al. | 340/347 |
| 3,422,226 | 1/1969 | Acs | 179/15 BA |

*Primary Examiner*—Maynard R. Wilbur
*Assistant Examiner*—Leo H. Boudreau
*Attorney*—R. S. Sciascia and Henry Hansen

[57] ABSTRACT

An analog-to-digital converter having a signal generator providing a sinusoidal reference signal which is to be compared to a high frequency analog signal, a plurality of threshold units each biased to trigger an output signal at a predetermined discrete level of the difference between the reference signal and the analog signal, a memory reset unit receiving the reference signal and providing a reset signal for clearing the output signals therefrom at a predetermined time in each cycle of the reference signal, and an encoder receiving the output signals of the threshold units and converting them into a digital code. The time of the reset signal is determined to be after either positive or negative peak of the reference signal.

4 Claims, 4 Drawing Figures

INVENTOR.
DENNIS E. FINERAN
SAMUEL J. FENDLEY

BY [signature]

ATTORNEY

INVENTOR.
DENNIS E. FINERAN
SAMUEL J. FENDLEY
BY
Henry Hansen
ATTORNEY

HIGH FREQUENCY ANALOG-TO-DIGITAL CONVERTER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to analog-to-digital converters, and more particularly to improvements in apparatus for obtaining discrete sampling of high frequency analog signals.

In many conventional A to D (analog-to-digital) converters a reference pulse of known amplitude and duration is periodically generated against which discrete samples of an analog signal to be converted is compared. The duration of the reference pulse determines the aperture or sampling time as referred to herein. The aperture time is usually a major source of error due to its uncertainty and more particularly due to the analog signal amplitude changing during the sampling time. In most low frequency converters, the amplitude changes of the analog signal are usually insignificant or tolerable over the narrow aperture times attainable for conventional techniques; but at high frequencies the generation and distribution of subnanosecond aperture times required to minimize the error have presented serious circuit design and packaging problems because of the gigahertz bandwidths required.

SUMMARY OF THE INVENTION

Accordingly, it is a general purpose and object of the invention to provide a novel and improved high frequency A to D converter having a relatively simple and inexpensive circuit and element configuration without any trade-off in high accuracy performance.

Briefly these and other objects are accomplished according to the invention by generating a sine wave sampling reference signal having a frequency above the bandwidth of the analog signal and an amplitude greater than the analog signal. The difference between the analog signal and the reference signal feeds across an array of parallel threshold units, each threshold unit being consecutively biased to trigger an output signal at a signal difference one increment higher than the preceding unit. Thus the signal difference is converted into discrete sets of output signals which are converted into a binary coded message by an encoder. Each output signal is irreversible within one message cycle, consequently the maximum signal difference occurs near the peak of the reference signal.

DESCRIPTION OF THE PREFERRED EMBODIMENT

Figure 1:
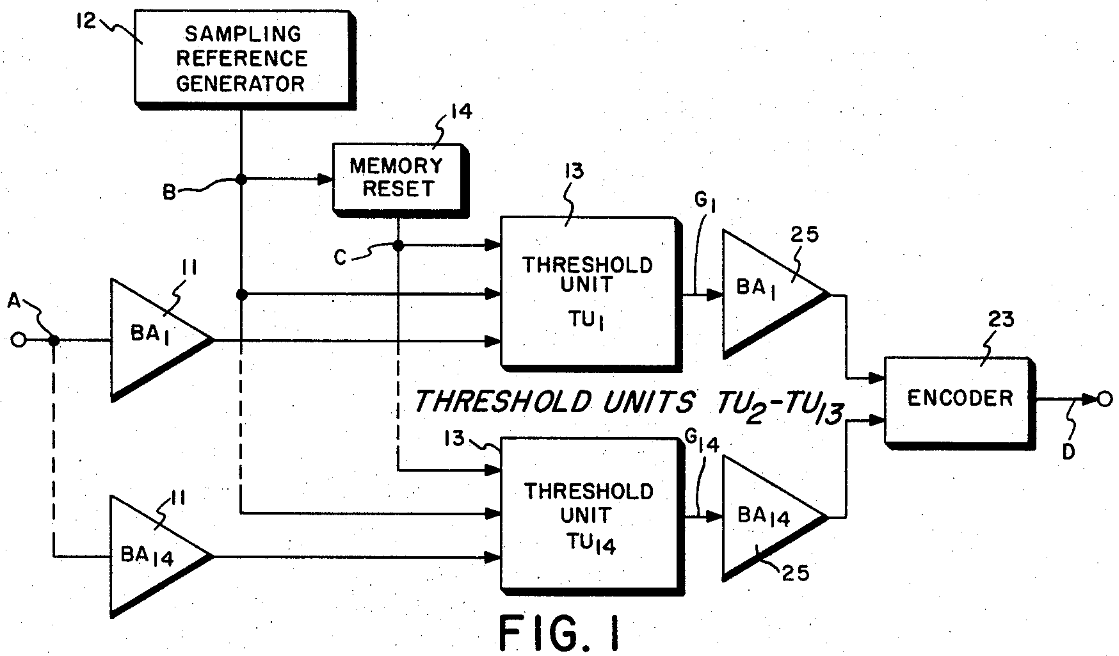
FIG. 1 is a block diagram of an A to D converter according to the invention.
Figure 2:
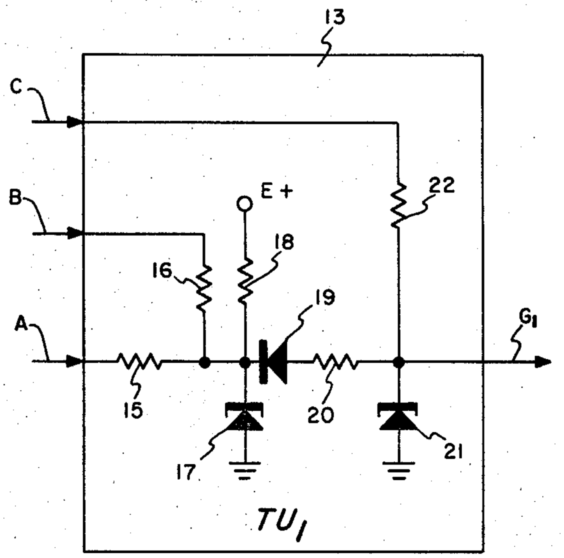
FIG. 2 is a schematic diagram of a threshold unit of the converter in FIG. 1.

Referring to the inventive embodiment of FIG. 1, an analog signal A which is to be converted is fed through fourteen parallel buffer amplifiers 11 to one input of respective threshold units 13. A reference signal generator 12, of a conventional type, provides a sinusoidal output signal B to another input of respective threshold units 13 and to the input of a memory reset 14. Signal B must be of a frequency greater than the highest anticipated frequency of signal A. Except as noted herein, threshold units 13 are identical and will be described by reference to FIG. 2 wherein signals A and B are respectively connected to one end of resistors 15 and 16 which are connected in common at their other ends to the cathode of a tunnel diode 17 and one end of a bias resistor 18. The anode of diode 17 is connected to ground and the other end of resistor 18 is connected to a d.c. power supply E+. Resistors 15 and 16 in combination with generator 12 must be selected to ensure that the peak current amplitude through resistor 16 is greater than the maximum peak anticipated current amplitude through resistor 15. Resistor 18 is selected for each threshold unit 13 for biasing currents therethrough to cause diode 17 to switch to a high voltage state at discrete increments of current differences through resistors 15 and 16 thereby producing a switching signal.

Figure 3:
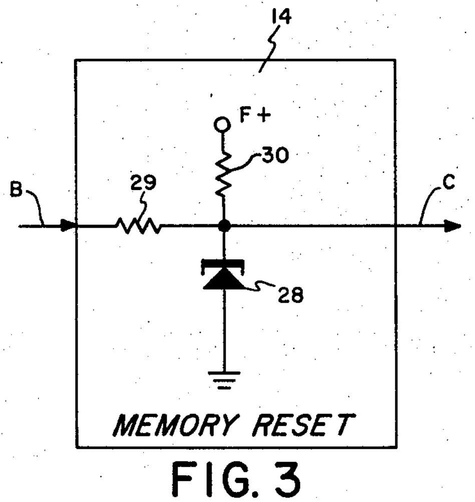
FIG. 3 is a schematic diagram of a memory reset of the converter in FIG. 1.

Referring now to FIG. 3, the reference signal B is fed to one end of a resistor 29 of memory reset 14, the other end being connected in common with the cathode of a tunnel diode 28 and one end of a biasing resistor 30. The other end of resistor 30 and the anode of diode 28 are connected respectively to a d.c. power supply F+ and to ground. The junction of resistors 29 and 30 provides a reset signal C. Resistor 30 is selected for a biasing current therethrough to cause diode 28 to switch to a high voltage state at a predetermined current through resistor 29 so that the off-time of signal C straddles the peak region of all anticipated frequencies of the difference between signal B and A. Signal C is connected through series connected resistors 22 and 20 (FIG. 2) to the anode of a diode 19, the cathode thereof being connected to the junction of resistors 15, 16 and 18. The cathode of a tunnel diode 21 is connected to the junction of resistors 20 and 22, and its anode is connected to ground. Diodes 19 and 21 function as a bistable switch passing the forward side of the switching signal and blocking the return side.

Diodes 21 at their cathodes provide output signals $G_1$ through $G_{14}$ for the respective threshold units 13 indicating whether, at any time within a reset cycle generated by signal C, the condition necessary to switch diode 17 was met. Accordingly, the combined output of the array of threshold units 13 is accumulative within each reset cycle such that a maximum signal difference between signal A and signal B is registered on respective diodes 21 within each reset cycle. The output signals $G_1$ to $G_{14}$ of respective threshold units 13 are, in turn, connected to respective buffer amplifiers 25. Amplifiers 25 generate input signals to an encoder 23 which are converted into a coded signal D for transmission.

Figure 4:
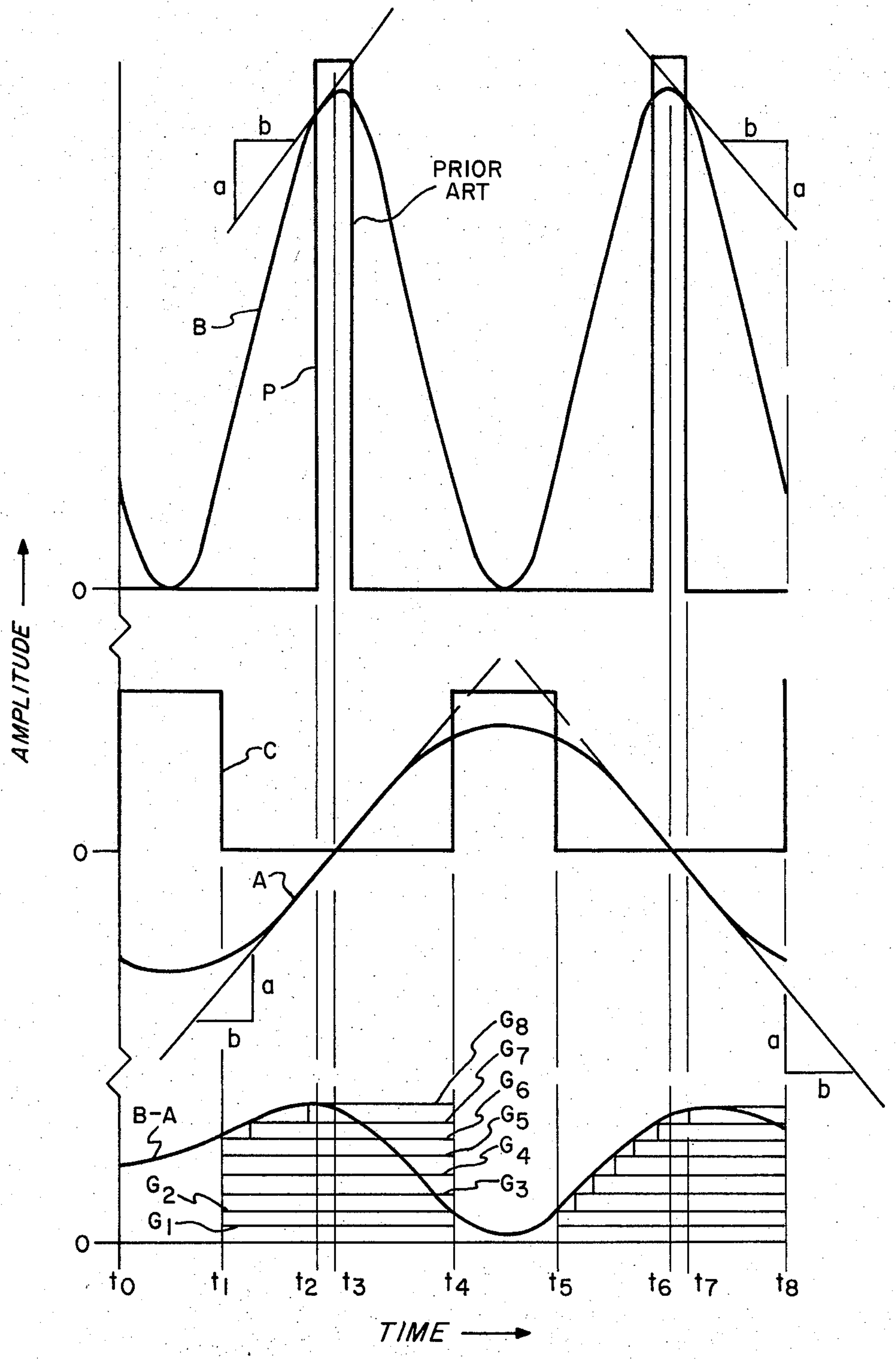
FIG. 4 graphically illustrates typical amplitude-time signals as applied to the inventive converter and a prior art converter.

Operation of the invention will now be summarized with reference to FIG. 4. A signal A represents a typical maximum amplitude and bandwidth analog signal to be converted. It is combined with a sampling reference signal B, the difference being signal B–A at the common connections of resistors 15 and 16. From time $t_0$ to $t_1$, memory reset 14 produces signal C at the cathode of diode 21 which blocks all outputs from the threshold units 13. As the amplitude of signal B–A increases from $t_1$ to $t_2$, threshold units 13 sequentially produce output signals $G_1$ through $G_8$ and remain on until cleared by signal C at $t_4$. Signals $G_1$–$G_8$ are therefore indicative of the maximum amplitude of signal B–A within one cycle of reset signal C and are converted by encoder 23 to binary coded signal D.

The maximum value of signal B–A will periodically occur at a time when the slope $a/b$ of signal B is equal to the slope $a/b$ of signal A. Specifically the maxima in signal B–A occur at times $t_2$ and $t_7$ which respectively lead and lag the peaks in signal B at $t_3$ and $t_6$. Signal A is shown with its maximum slopes occurring proximate the peaks of signals B, thus times $t_2$ and $t_7$ indicate the largest increment of lead and lag respectively. A signal P is shown depicting a typical prior art rectangular pulse sampling reference of an aperture coincident with $t_2$ and $t_7$ at the forward and return sides respectively. Accordingly the effective aperture of the inventive converter is shown to be equal to the aperture of a prior art rectangular pulse sampling converter where the prior art sampling signal requires a significantly higher and wider bandwidth for its reproduction.

Thus, the invention provides by combining a commonly available sine wave generator with a plurality of threshold units 13, made up of commonly available tunnel diodes 17 and 21, and buffered by typical buffer amplifiers 11 and 25, a sampling device which is comparable or better in accuracy than the prior art rectangular pulse sampling methods. This reduction in bandwidth is of particular value in applications where the input signal frequency domain is in the gigahertz region. The sampling device output produced is referenced to the peaks of the sinusoidal signal B thus providing for discrete sampling of an analog signal A at a known time and with respect to a known signal amplitude.

Some of the many advantages and improvements over the prior art should now be readily apparent. The above-described system provides significant improvements over the prior art by allowing a much narrower bandwidth and also a much lower bandwidth to serve the same function and at the same accuracy than that of a pulse reference system. It is particularly significant in a high frequency domain since at that frequency any extensions of bandwidth are critical. Aperture time is no longer significant since the reference signal now more closely approximates a triangular reference which by its shape alone precludes the necessity of a tight aperture. Also, if it is found that errors due to peak flatness are undesirable, accuracy can be improved by simply increasing the amplitude of the sine wave reference signal. This is not possible with a rectangular pulse.

Obviously, many modifications and variations of the present invention are possible in the light of the above teachings. It is therefore to be understood that in the scope of the appended claims the invention may be practiced otherwise than as specifically described.

What is claimed is:

1. A high frequency analog-to-digital converter for an analog signal comprising, in combination:

signal generating means for producing a sinusoidal sampling reference signal at a frequency and amplitude always greater than the maximum anticipated frequency and amplitude of an analog signal to be converted;

reset means connected to receive the reference signal for producing a reset pulse in each cycle thereof; and threshold means including a plurality of threshold units each unit having subtracting means adapted to receive the analog signal and connected to receive the sinusoidal reference signal for providing output difference signals indicative of an amplitude difference between the analog and reference signals, and including first and second resistors having their one ends connected in common and their other ends receiving respectively the analog and sinusoidal reference signals, and wherein the resistances of said first and second resistors is selected to provide a greater peak current of the reference signal through said second resistor than the anticipated peak current of the analog signal through said first resistor, and sampling means connected to receive the difference signals and the reset pulse for producing parallel output signals indicative of a peak amplitude of respective ones of the difference signals between adjacent reset pulses, and including a third resistor having its one end connected in common to said first and second resistors and its other end to a d.c. signal, and a diode unit connected to an input to the one ends of said resistors and providing the threshold unit output signal, the duration between the reset pulses being preselected to include the time of the peak amplitude of all anticipated frequencies of the difference signals.

2. An analog-to-digital converter according to claim 1, wherein:

the resistance of said third resistor in respective ones of said threshold units is selected to provide a discrete biasing current corresponding to increasing increments of the signal difference between the currents in said first and second resistors.

3. An analog-to-digital converter according to claim 2 further comprising:

said diode unit in respective ones of said threshold units including a first tunnel diode connected at its anode to ground and connected at its cathode to the one ends of said first, second and third resistors for providing a switching signal when the current sum of said first, second and third resistor exceeds the switching current of said first tunnel diode, a blocking diode connected at its cathode to the cathode of said first tunnel diode and at its anode to one end of a loading resistor, a second tunnel diode connected at its cathode to the other end of said loading resistor and at its anode to ground for storing the switching of said first tunnel diode, and a reset resistor connected at one end to the cathode of said second tunnel diode and the other end receiving the reset pulses for clearing the signal stored in said second tunnel diode and for producing the output signal at the cathode of said second tunnel diode of respective ones of said threshold units.

4. A high frequency analog-to-digital converter according to claim 3 further comprising, in combination: encoder means receiving the parallel output signals for producing a digitally encoded signal thereof.

* * * * *